(12) United States Patent
Marx

(10) Patent No.: US 7,113,136 B2
(45) Date of Patent: Sep. 26, 2006

(54) INTEGRATED DUAL FUNCTION CIRCUITRY AND ANTENNA SYSTEM

(75) Inventor: Thomas Marx, Brighton, MI (US)

(73) Assignee: Collins & Aikman Products Co., Southfield, MI (US)

( * ) Notice: Subject to any disclaimer, the term of this patent is extended or adjusted under 35 U.S.C. 154(b) by 0 days.

(21) Appl. No.: 10/450,934

(22) PCT Filed: Dec. 18, 2001

(86) PCT No.: PCT/US01/48978

§ 371 (c)(1),
(2), (4) Date: Dec. 1, 2003

(87) PCT Pub. No.: WO02/50949

PCT Pub. Date: Jun. 27, 2002

(65) Prior Publication Data

US 2004/0080459 A1    Apr. 29, 2004

Related U.S. Application Data

(60) Provisional application No. 60/264,119, filed on Jan. 25, 2001, provisional application No. 60/256,660, filed on Dec. 18, 2000.

(51) Int. Cl.
*H01Q 1/32* (2006.01)
*G01R 1/00* (2006.01)

(52) U.S. Cl. ............... 343/703; 343/711; 343/700 MS; 343/829; 343/713

(58) Field of Classification Search ............... 343/703, 343/711, 700 MS, 702, 830, 829, 713, 795, 343/841, 712, 846, 848, 714
See application file for complete search history.

(56) References Cited

U.S. PATENT DOCUMENTS

| | | | | |
|---|---|---|---|---|
| 3,816,836 A | * | 6/1974 | Smith | 503/201 |
| 3,896,448 A | * | 7/1975 | Killen et al. | 343/713 |
| 4,721,963 A | * | 1/1988 | Nagy et al. | 343/712 |
| 4,758,166 A | | 7/1988 | Bonnett et al. | 343/712 |
| 4,853,703 A | | 8/1989 | Murakami et al. | 343/700 |
| 4,853,793 A | | 8/1989 | Ishikawa et al. | 358/464 |
| 5,402,134 A | | 3/1995 | Miller et al. | 343/742 |
| 5,438,338 A | * | 8/1995 | Thill | 343/700 MS |
| 5,551,913 A | | 9/1996 | Peifer | 454/121 |
| 5,565,877 A | * | 10/1996 | Du et al. | 343/715 |
| 5,615,088 A | | 3/1997 | Mizumo | 361/749 |
| 5,625,371 A | | 4/1997 | Miller et al. | 343/867 |
| 5,633,645 A | * | 5/1997 | Day | 343/700 MS |
| 5,811,732 A | | 9/1998 | Beam | 174/72 |
| 5,861,857 A | | 1/1999 | Kozak | 343/711 |
| 5,926,136 A | * | 7/1999 | Ohtsuka et al. | 343/700 MS |
| 5,952,630 A | | 9/1999 | Filion et al. | 200/5 R |
| 5,959,581 A | * | 9/1999 | Fusinski | 343/700 MS |

(Continued)

*Primary Examiner*—Tho Phan
*Assistant Examiner*—Chuc Tran
(74) *Attorney, Agent, or Firm*—Grossman, Tucker, Perreault & Pfleger PLLC

(57) ABSTRACT

A trim panel for a vehicle containing a vehicular antenna system comprising a substrate, an outer skin and a foam disposed between the substrate and the outer skin. An antenna/circuitry system (2) is located on the upper surface of the substrate (1) and is in contact with the urethane foam (7), the antenna/circuitry system (2) comprising an insulating base layer (12) including upper and lower surfaces and an electro-conductive antenna layer on the upper surface of the base layer (12) and an electro-conductive circuit layer on the lower surface of the base layer (12).

16 Claims, 2 Drawing Sheets

U.S. PATENT DOCUMENTS

| | | | |
|---|---|---|---|
| 6,023,243 A * | 2/2000 | Frank | 343/700 MS |
| 6,081,239 A | 6/2000 | Sabet et al. | 343/753 |
| 6,087,990 A * | 7/2000 | Thill et al. | 343/700 MS |
| 6,118,665 A | 9/2000 | Kishida et al. | 361/749 |
| 6,144,343 A | 11/2000 | Furuya et al. | 343/713 |
| 6,353,415 B1 * | 3/2002 | Ashtiani et al. | 343/713 |
| 6,371,548 B1 | 4/2002 | Misaras | 296/146.7 |
| 6,483,048 B1 | 11/2002 | Bontrager et al. | 200/5 R |
| 6,552,685 B1 * | 4/2003 | Zhang | 343/700 MS |
| 6,756,945 B1 * | 6/2004 | Mizutani | 343/713 |
| 6,850,191 B1 * | 2/2005 | Thill et al. | 343/700 MS |

* cited by examiner

INTEGRATED DUAL FUNCTION CIRCUITRY AND ANTENNA SYSTEM

CROSS REFERENCE TO RELATED APPLICATIONS

This application is the U.S. National Stage of International Application No. PCT/US01/48978 filed Dec. 18, 2001 and published Jun. 27, 2002 as International Publication No. WO 02/50949, designating the United States, and which claims benefit of U.S. Provisional Application Nos. 60/264,119 filed Jan. 25, 2001 and 60/256,660 filed Dec. 18, 2000.

FIELD OF THE INVENTION

This invention relates to an integrated antenna system suitable for vehicular use. In such regard, a complete vehicle antenna system is disclosed that can be integrated with one or more other vehicle components and, in particular, with interior components such as the instrument panel. The invention also relates to an antenna system which is integrated with a flexible printed circuit or other flat wire which replaces current wire harness construction (i.e. with round wire) in providing an electrical circuit routing electric current between one or more connected electrical devices. Such an antenna with the flexible printed circuit may also be integrated with one or more other vehicle components and, in particular, with interior components such as the instrument panel.

BACKGROUND OF THE INVENTION

In general, two forms of automotive antennas find widespread use, i.e., the mast antenna and the windshield antenna. The mast antenna comprises a rod conductor projecting from the vehicle body. It is fairly well established that the mast antenna is subject to deterioration by exposure, is prone to damage from external objects, and is easy prey for vandals. Further, mast antennas may detract from the aesthetic appearance of the vehicle. Of course, the mast antenna may be powered to retract, which adds cost to the vehicle.

Windshield antennas make use of one or more thin conductors embedded within the windshield of the automobile. Windshield antennas are also susceptible to their own problems, such as unnecessary replacement simply because the glass has been damaged. In addition, windshield antennas are reportedly susceptible to various forms of FM distortion, such as "station swapping" and may be sensitive to the direction of vehicle travel. Moreover, operation of the windshield washers may create undesirable effects upon the performance of a windshield antenna including the generation of noise. Furthermore, by mounting the antenna on the exterior or interior of the vehicle as separate components or integrating the antenna into window glass, a need is developed to route antenna cables between the electronic component and the antenna location. Such antenna cable is typically installed and connected by the auto manufacturer during assembly of the vehicle.

In related context, current vehicle electrical systems also require the manufacturer to route a wire harness throughout the vehicle body, and more specifically, through the instrument panel cockpit system. Such wire harnesses are generally bulky, expensive, heavy, difficult to install and often a source of a variety of warranty problems.

Attention is directed to the following U.S. Patents and the art cited therein to provide an even broader consideration of the variety of problems and solutions that have been proposed to date to improve upon antenna placement and/or wiring within an automotive environment: U.S. Pat. No. 3,896,448 "Instrument Panel Radio Antenna"; U.S. Pat. No. 4,758,166 "Concealed Radio Antenna"; U.S. Pat. No. 4,853,793 "Microstrip Antenna with Stripline And Amplifier"; U.S. Pat. No. 5,811,732 "Modular Wiring System for Vehicle Instrument Panel Wire"; U.S. Pat. No. 5,861,857 "Vehicular Windshield Wiper Antenna System"; U.S. Pat. No. 6,081,239 "Planar Antenna Including A Superstrate Lens Having An Effective Dielectric Constant"; and U.S. Pat. No. 6,144,343 "Display Antenna Center".

It is therefore an object of this invention to provide a remedy to the problems noted above in addition to the development of an vehicular antenna system that provides some unique advantages not reported in the prior art to date.

SUMMARY OF THE INVENTION

A trim panel for a vehicle containing a vehicular antenna system comprising a substrate, an outer skin and a foam disposed between the substrate and the outer skin. An antenna/circuitry system is located on the upper surface of the substrate and is in contact with the urethane foam, the antenna/circuitry system comprising an insulating base layer including upper and lower surfaces and an electro-conductive antenna layer on the upper surface of the base layer and an electro-conductive circuit layer on the lower surface of the base layer.

BRIEF DESCRIPTION OF THE DRAWINGS

These and other objects, features and advantages of the invention will become apparent upon consideration of the description of the invention and the appended drawings in which.

The above and other objects, features and advantages of the present invention will be apparent in the following detailed description thereof when read in conjunction with the appended drawings wherein the same reference characters denote the same or similar paths throughout the several views.

DESCRIPTION OF THE PREFERRED EMBODIMENTS

Figure 1:
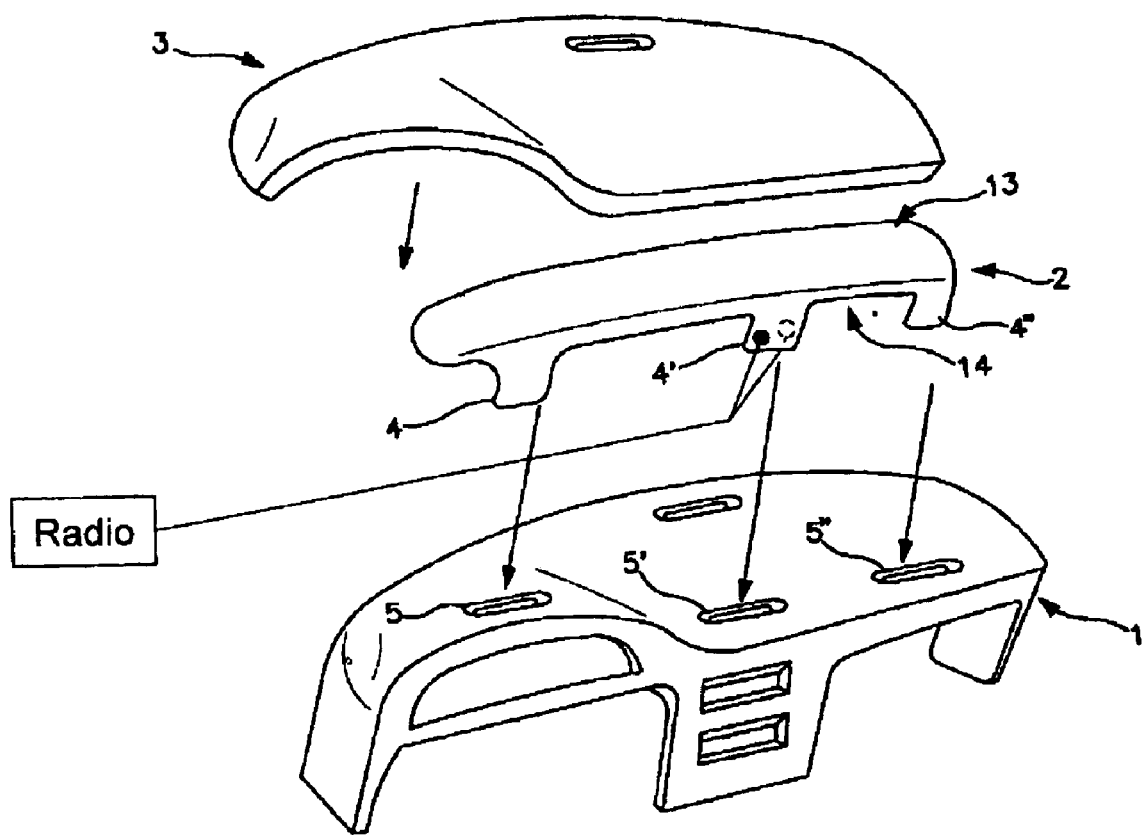
FIG. 1 is a representative exploded perspective view of an exemplary vehicle instrument panel which contains the invention.

For elements common to the various embodiments of the invention, the numerical reference character between the embodiments is held constant, but distinguished by the addition of an alphanumeric character to the existing numerical reference character. In other words, for example, an element referenced at 10 in the first embodiment is correspondingly referenced at 10A, 10B, and so forth in subsequent embodiments. Thus, where an embodiment description uses a reference character to refer to an element, the reference character applies equally to other embodiments as distinguished by alphanumeric character.

Attention is now directed to FIG. 1, which best illustrates a preferred embodiment of the subject invention. As shown therein, the rigid substrate 1 is designed to accommodate the dual-function antenna/circuitry system. The dual-function antenna/circuitry system 2 is then mounted on the rigid substrate, followed by incorporation of the skin/foam layer 3 to form the instrument panel. In this manner, the dual-function antenna/circuitry system is retained as to not rattle and comply with NVH (noise, vibration, harshness) requirements and BSR (buzz, squeak, rattle) requirements.

As can be seen, the upper (topside) surface 13 of the antenna/circuitry system 2 comprises the antenna array, suitable for reception of radio transmissions, cellular phone frequencies, global positioning systems (GPS) and other miscellaneous transmissions, such as locking/unlocking signals, keyless ignition, alarm, wireless internet access, etc. Placement of the antenna array on the upper (topside) surface maximizes the efficiency of signal reception. On the bottom side 14 of the antenna/circuitry system 2 is located the electro-conductive circuitry which would replace all or part of the electrical wire harness that supplies power in the vehicle dashboard area.

Inclusion of flexible printed circuitry into vehicle interior trim panels is disclosed in U.S. patent application Ser. Nos. 09/625,113 and 09/625,117 to the same assignee as this invention and are incorporated herein by reference.

Figure 2:
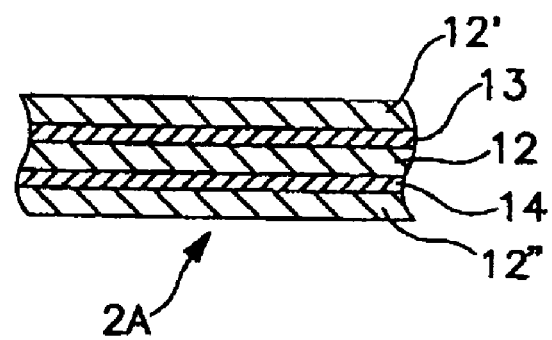
FIG. 2 is a representative cross-sectional view taken through the antenna/circuit system.

Trim panels are generally multi-layered components formed by a variety of processes including but not limited to, injection molding, blow-molding, lamination, foaming-in-place, thermoforming, etc. The preferred construction consists of a skin/foam/substrate construction as shown in FIGS. 1 and 2. To include the antenna/circuitry system of the present invention into a trim panel of this type, the antenna/circuitry system 2 is attached to or through the instrument panel substrate 1 by adhesive or other mechanical attachment means known to those skilled in the art. The antenna circuitry system 2 may also be fitted into a slightly recessed area of the top surface of the substrate 1 for attachment and location. Alternatively, as shown in FIG. 1, extensions 4, 4' and 4" of the antenna circuitry/system 2 may be provided to include connectors (not shown) which are passed through slotted openings 5, 5' and 5" in the substrate which also serve to locate and attach the antenna circuitry system to the substrate.

The connectors (not shown) are used to connect the antenna and electrical circuitry to the radio and other electrical devices in the cockpit area of the vehicle. As shown in FIG. 1, typical locations include, but are not limited to, the speedometer/gauge area 5 and the passenger side air bag area 5". For connection to the radio through slot 5', the antenna electro-conductive layer 13 can be configured such that the impedance for the receiver and antenna match, minimizing power loss.

Figure 3:
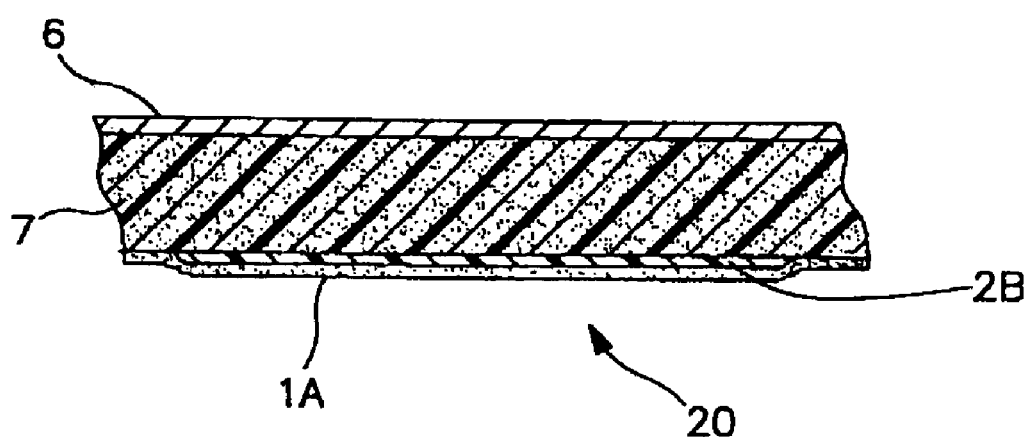
FIG. 3 is a representative cross-sectional view of one type of instrument panel construction of the invention.

The antenna/circuitry system is included in the construction of the instrument panel 20 in a manner known to those skilled in the art, by mounting the substrate 1 containing the antenna/circuitry system 2 to the lid of a foaming mold, placing a skin 6 (see FIG. 3) into the corresponding cavity of a foaming mold and dispensing urethane foam precursor between the substrate 1A and skin 6. The foam precursor expands to fill the cavity between the skin and substrate at least partially or fully encapsulating the antenna/circuitry system 2B in a cellular foam layer 7. In FIG. 3, the antenna/circuitry system 2B is on the surface of the substrate 1A, and in contact and/or embedded in the urethane foam 7. It can therefore be appreciated that the foam layer 7 in contact with the antenna/circuitry system 2B can serve to immobilize and locate the antenna/circuitry system in a convenient manner.

As alluded to above with respect to the use of a recess in the top surface of the substrate, other constructions may include thermoforming a grained skin/foam laminate directly over the substrate in which the antenna/circuitry system has been counter-sunk into a corresponding groove or shallow depression on the surface of the substrate. In this manner the antenna/circuitry system substantially fills in the groove or depression to yield a substantially smooth surface over which the skin foam laminate can be formed. Polymeric materials are preferred for the skin 6, foam 7 and or substrate 1A, as they are substantially transparent to electromagnetic radio wave energy. Such polymer materials for the skin 6 include polyurethanes and poly(vinyl chloride) type materials. Suitable polymer materials for the foam layer also include the polyurethanes. The substrate may be prepared from acrylonitrile-butadiene-styrene (ABS) type materials, and blends thereof with materials such as polycarbonate.

Turning to FIG. 2, the construction of another preferred antenna/circuitry system 2A is shown. The system comprises a multilayer structure which includes a base layer 12 made up of an insulator such as a polyimide, a first antenna pattern layer 13 comprising an electro-conductive film, such as a copper film, formed on the upper side of base layer 12 and a first circuit pattern layer 14 comprising an electro-conductive film, such as a copper film, formed on the lower side of base 12, a first cover layer 12' made up of an insulator such as a polyimide located on the upper surface of the antenna pattern layer 13 and a second cover layer 12" made up of an insulator such as a polyimide located on the lower side of circuit pattern layer 14.

In accordance with the above, it can be appreciated by those of skill in the art that the use of a base layer 12 of polyimide, and a first antenna pattern layer 13 comprising copper film, and a first circuit pattern 14 also of copper film, creates a flexible antenna/circuitry system in the sense that such system can be flexed without disrupting the conductivity and performance of the copper film and will readily configure and locate on the upper surface of a vehicle substrate. In such regard, the antenna/circuitry system herein can alter its shape to adjust to the varying contours of a trim panel substrate, and then be uniquely immobilized on the substrate, when positioned under, the instrument panel skin layer and within the foam layer, as previously described.

In yet other methods of integration, the dual purpose electrical and antenna system could be fastened (e.g. mechanically) or bonded (e.g. adhesive, welded) or otherwise affixed or connected to another supporting vehicle component (i.e. a component which would physically provide support to the dual purpose electrical and antenna system in its use state). For example, the dual purpose electrical and antenna system could be mounted to the interior surface of the instrument panel substrate, a rear package shelf, a pillar trim panel, a headliner, an exterior cowl panel, etc.

In sum, several advantages are now possible via the use of the present invention, which are summarized below:
- an antenna system that is upwardly facing through the front window of the vehicle thereby providing maximum exposure to radio signal reception;
- the reduction in cost necessary to manufacture window glass antennae;
- the elimination of exterior antenna components;
- the elimination of costly antenna leads between the radio and current antenna systems;
- the elimination of antenna cable installation in vehicular assembly plants;

the elimination of the need to seal external antenna components against the environment;

the elimination of conventional wire harnessing in instrument panel assembly;

the elimination of wire harness assembly requirements;

the reduction in warranty claims as related to wire harness and antenna system performance;

the reduction in cost of the electrical system;

the reduction in weight of the vehicular electrical system;

increased usable space in the instrument panel assembly; and the elimination of associated wire harness and antenna connectors.

Finally, in the context of the present invention, it can be appreciated that the specific antenna/circuitry combination for the instrument panel can be customized for each vehicle dependent upon vehicle design requirements. In addition, once the vehicle design is considered, the antenna/circuitry combination herein can itself be adjusted to maximize its broadband characteristics so that it will efficiently receive and/or transmit as necessary. In such regard, antenna length can be conveniently varied across the instrument panel surface in length/width and/or depth from the surface to optimize transmission and reception functionality.

I claim:

1. A trim panel for a vehicle containing a vehicular antenna system comprising:
    a substrate;
    an outer skin;
    a foam disposed between said substrate and said outer skin;
    an antenna/circuitry system located on the upper surface of said substrate in contact with said foam, said antenna/circuitry system comprising an insulating base layer with an upper and lower surface, an electro-conductive antenna layer on the upper surface base layer, an electro-conductive circuit layer on the lower surface of said base layer, said electro-conductive circuit layer conducting electrical current from a source in said vehicle to supply power to the area of the trim panel; and
    a first insulating cover layer on the upper surface of said antenna electro-conductive layer and a second insulating cover layer on the lower surface of said electro-conductive circuit layer.

2. The trim panel of claim 1 wherein said antenna layer comprises copper.

3. The trim panel of claim 1 wherein said electro-conductive circuit layer comprises copper.

4. The trim panel of claim 1 wherein said insulating base layer comprises a polyimide.

5. The trim panel of claim 1 wherein said first and second insulating cover layers comprise a polyimide.

6. The trim panel of claim 1 wherein said electro-conductive antenna layer and said electro-conductive circuit layer are connected to a radio in said vehicle.

7. The trim panel of claim 6, wherein said electro-conductive antenna layer has an impedance, and said radio has an impedance, and said electro-conductive antenna layer is configured to match said radio impedance.

8. The trim panel of claim 1 wherein said electro-conductive antenna layer is configured to receive one or more of a radio transmission, a cellular phone frequency, a global positioning transmission, a locking/unlocking signal for said vehicle, a keyless ignition frequency and/or a wireless internet access transmission.

9. A trim panel for a vehicle containing a vehicular antenna system comprising:
    a substrate;
    an outer skin;
    a foam disposed between said substrate and said outer skin;
    an antenna/circuitry system located on the upper surface of said substrate in contact with said foam, said antenna/circuitry system comprising an insulating base layer including upper and lower surfaces and an electro-conductive antenna layer on the upper surface of said base layer and an electro-conductive circuit layer on said lower surface of said base layer, said electro-conductive circuit layer conducting electrical current from a source in said vehicle to supply power to the area of the trim panel, wherein said insulating base layer comprises a polyimide.

10. The trim panel of claim 9 wherein said antenna layer comprises copper.

11. The trim panel of claim 9 wherein said circuit layer comprises copper.

12. The trim panel of claim 9 including a first insulating cover layer on said antenna electro-conductive layer and a second insulating cover layer on said electro-conductive circuit layer.

13. A trim panel for a vehicle containing a vehicular antenna system comprising:
    a substrate;
    an outer skin;
    a foam disposed between said substrate and said outer skin;
    an antenna/circuitry system located on the upper surface of said substrate in contact with said foam, said antenna/circuitry system comprising an insulating base layer including upper and lower surfaces and an electro-conductive antenna layer on the upper surface of said base layer and an electro-conductive circuit layer on said lower surface of said base layer, said system further including a first insulating cover layer on said antenna electro-conductive layer and a second insulating cover layer on said electro-conductive circuit layer, said electro-conductive circuit layer conducting electrical current from a source in said vehicle to supply power to the area of the trim panel.

14. The trim panel of claim 13 wherein said antenna layer comprises copper.

15. The trim panel of claim 13 wherein said circuit layer comprises copper.

16. The trim panel of claim 13 wherein said insulating base layer comprises a polyimide.

* * * * *